(12) United States Patent
Hayes

(10) Patent No.: US 6,888,153 B2
(45) Date of Patent: May 3, 2005

(54) CAPACITIVE SHIELD FOR CONTAINING RADIOFREQUENCY MAGNETIC FIELDS

(75) Inventor: Cecil E. Hayes, Seattle, WA (US)

(73) Assignee: University of Washington, Seattle, WA (US)

(*) Notice: Subject to any disclaimer, the term of this patent is extended or adjusted under 35 U.S.C. 154(b) by 489 days.

(21) Appl. No.: 09/826,326

(22) Filed: Apr. 4, 2001

(65) Prior Publication Data

US 2001/0035504 A1 Nov. 1, 2001

Related U.S. Application Data

(60) Provisional application No. 60/194,718, filed on Apr. 5, 2000.

(51) Int. Cl.⁷ .............................. G21F 1/00; G21F 3/00; G21F 5/00; G21F 7/00; G21C 11/00
(52) U.S. Cl. ........................ 250/515.1; 439/55; 439/83; 118/723 E; 118/728; 315/111.21; 315/111.51; 324/318
(58) Field of Search ........................ 250/515.1; 439/55, 439/83; 118/723 E, 728; 315/111.21–51, 111.51

(56) References Cited

U.S. PATENT DOCUMENTS

| | | | |
|---|---|---|---|
| 4,642,569 A | 2/1987 | Hayes et al. ................. 324/318 |
| 4,692,705 A | 9/1987 | Hayes ......................... 324/318 |
| 4,751,464 A | 6/1988 | Bridges ....................... 324/318 |
| 5,028,872 A * | 7/1991 | Nakabayashi ................ 324/318 |
| 5,396,173 A * | 3/1995 | Sakakura et al. ............ 324/318 |
| 5,489,847 A | 2/1996 | Nabeshima et al. ........ 324/318 |
| 5,642,087 A * | 6/1997 | Crow .......................... 335/216 |
| 5,680,047 A | 10/1997 | Srinivasan et al. ......... 324/318 |
| 5,717,371 A * | 2/1998 | Crow .......................... 335/216 |
| 5,986,455 A * | 11/1999 | Magnuson ................... 324/318 |
| 5,990,681 A | 11/1999 | Richard et al. ............. 324/318 |
| 6,297,636 B1 * | 10/2001 | Shimo et al. ............... 324/318 |
| 6,498,947 B2 * | 12/2002 | Boskamp et al. ........... 600/422 |
| 2001/0035504 A1 * | 11/2001 | Hayes ...................... 250/515.1 |
| 2002/0120191 A1 * | 8/2002 | Boskamp et al. ........... 600/422 |
| 2004/0032262 A1 * | 2/2004 | Withers et al. ............. 324/318 |

FOREIGN PATENT DOCUMENTS

EP 0724164 A1 * 7/1996 ......... G01R/33/442

* cited by examiner

Primary Examiner—John R. Lee
Assistant Examiner—Bernard E. Souw
(74) Attorney, Agent, or Firm—Crompton, Seager & Tufte, LLC

(57) ABSTRACT

RF magnetic shields which support tangential electric fields. The RF shields are particularly suited for use in magnetic resonance imaging (MRI) systems, but may also be used in other radio frequency applications. The RF magnetic shields may include a dielectric layer having conductive regions separated by non-conductive regions on each side thereof to form a plurality of capacitive elements. The capacitive elements are partially non-conductive at radio frequencies such that the electrical component tangent to the shield is supported and the magnetic component perpendicular to the shield is blocked. The size and shape of the non-conductive and conductive regions are selected to develop a capacitive voltage across the capacitive elements at radio frequencies, and be substantially non-conductive at frequencies other than RF. The RF magnetic shields provide an electrical field that is uniform around the entire sample volume.

23 Claims, 8 Drawing Sheets

*Fig. 4*
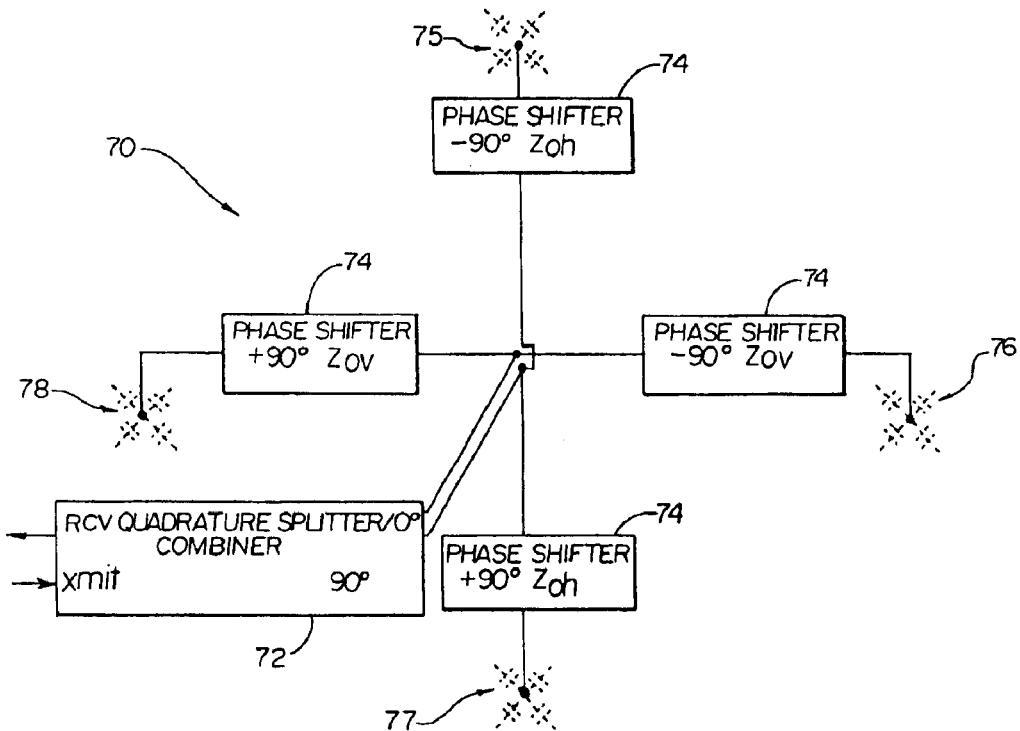
*Fig. 5A*  *Fig. 5B*
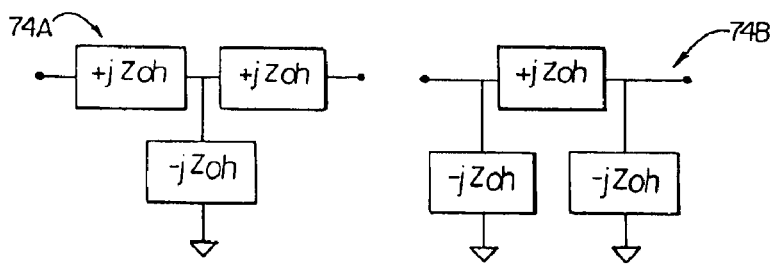
*Fig. 5C*  *Fig. 5D*
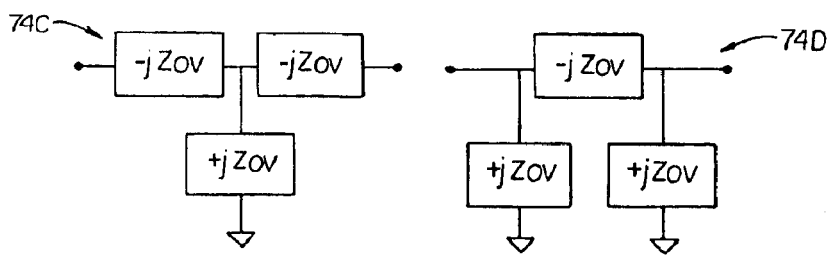

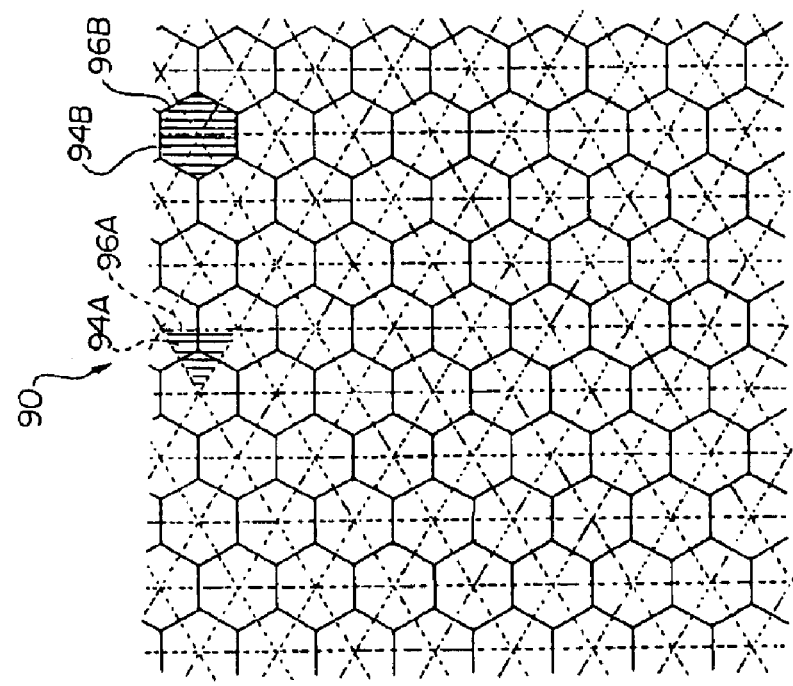
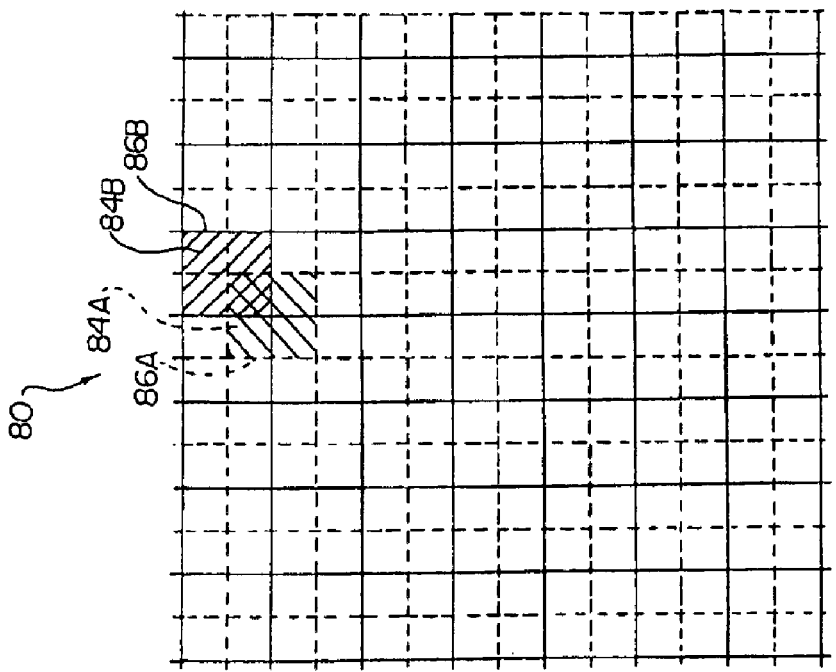

CAPACITIVE SHIELD FOR CONTAINING RADIOFREQUENCY MAGNETIC FIELDS

CROSS REFERENCE

Pursuant to 35 U.S.C. §119(e), the present application claims the priority benefit of U.S. Provisional Patent Application Ser. No. 60/194,718, filed Apr. 5, 2000, entitled CAPACITIVE SHIELD FOR CONTAINING RADIOFREQUENCY MAGNETIC FIELDS, the entire disclosure of which is hereby incorporated by reference.

FIELD OF THE INVENTION

The present invention generally relates to devices and methods for shielding radiofrequency magnetic fields, particularly in the field of nuclear magnetic resonance imaging.

BACKGROUND OF THE INVENTION

Magnetic resonance imaging (MRI) is a clinically significant diagnostic tool because of its ability to readily image and distinguish different types of soft tissue. Water protons predominantly found in soft tissue have a detectable, albeit weak, nuclear magnetic moment or spin. The nuclear magnetic moments are randomly oriented, but become aligned when placed in a strong static magnetic field ($B_0$). However, the nuclear magnetic moments are too weak to be measured in such a static magnetic field.

By applying an oscillating magnetic field ($B_1$), the nuclear magnetic moments may be made to oscillate or precess at a frequency which is characteristic of the soft tissue. The oscillating magnetic field preferably comprises a rotating radiofrequency (RF) magnetic field, which also creates a fictitious field aligned with the static field. By tuning the RF magnetic field ($B_1$), the static magnetic field ($B_0$) may be effectively cancelled out.

The oscillating nuclear magnetic moments create a magnetic flux that varies as a function of time, which induces electric current flow in a conductive coil, and therefore may be detected using a loop antenna. The electric signal induced by the time varying magnetic flux in the loop antenna is proportional to the nuclear magnetic moments. Preferably, the oscillating magnetic field ($B_1$) is applied such that the nuclear magnetic moments oscillate in a plane perpendicular the static field ($B_0$) where the received signal may be maximized.

Because water protons oscillate at the same resonant frequency, the received signal may be used to detect water in a sample. In MRI, the magnetic filed is spatially varied using gradient magnetic fields such that the amount of water in a given region may be determined. Because water protons are predominant in soft tissue, this permits localization of soft tissue. Different types of soft tissue may be further identified using various contrast techniques which utilize relaxation time, chemical resonant frequency, or other attributes to distinguish different types of soft tissue.

In a typical MRI scanner, the RF magnetic field ($B_1$) is generated by an RF coil and the gradient magnetic fields are generated by three gradient coil windings (X, Y, Z) which surround the RF coil. To prevent the RF magnetic field ($B_1$) from interfering with the surrounding gradient coils windings, it is desirable to restrict the spatial extent of the RF magnetic field ($B_1$) using an RF shield around the RF coil. The most straightforward approach for such an RF shield is to use a thin cylinder of copper foil around the RF coil. The RF shield is kept as thin as possible because the switching of field gradients during the imaging process induces eddy currents in the RF shield that may corrupt the gradient waveforms.

A more effective alternative is to cut up the RF shield into a number of smaller areas to decrease the eddy currents, but to reconnect the pieces with multiple RF bypass capacitors. The capacitors are chosen so that the shield appears to be a short circuit at radio frequencies, but conducts minimal currents at the audio frequencies produced by the field gradient switching.

An example of this alternative approach is disclosed in U.S. Pat. No. 4,642,569 to Hayes et al., which describes a shield fabricated from thin PTFE circuit board double sided with copper foil, wherein the copper foil is cut into discrete regions to form an overlapping array of conductive regions on either side of the circuit board. This arrangement provides an intrinsic capacitance between the two sides of the circuit board which serve as bypass capacitors across the cuts in the foil surfaces. The cut patterns in the circuit board are chosen to run largely parallel to the expected RF currents in the shield, so a minimal number of capacitive gaps are encountered as the RF current completes its path around the shield. The capacitive elements are selected to provide a short circuit at radio frequencies.

RF shields can also be used to redirect or reflect the distribution of magnetic fields generated by an RF magnetic coil. For example, in a head coil such as a birdcage resonator, placing a shield or endcap across one end of the birdcage resonator will improve the field homogeneity at that end by preventing the RF flux from diverging out. An example of an endcap shield is disclosed in U.S. Pat. No. 4,692,705 to Hayes, which describes a highly conductive RF endcap shield to prevent bulging of the RF magnetic filed.

The highly conductive RF endcap shield prevents bulging by virtue of electromagnetic boundary conditions. A first boundary condition requires the perpendicular component of magnetic field to be zero at the surface. A second boundary condition requires that the tangential component of the electric field be zero at the surface. The second boundary condition is not always desirable because of possible de-tuning effects, dielectric losses, and the need for larger electric fields elsewhere.

SUMMARY OF THE INVENTION

Rather than eliminating the tangential electric field at the top of the head, it is preferable to uniformly distribute the tangential component of the electric field to minimize de-tuning effects and dielectric losses. To this end, the present invention provides various embodiments of RF magnetic shields which support tangential electric fields. The RF shields of the present invention are particularly suited for use in magnetic resonance imaging (MRI) systems, but may also be used in other nuclear magnetic resonance (NMR) applications.

In a preferred embodiment, the RF magnetic shield includes a dielectric layer having a plurality of conductive regions separated by non-conductive regions on each side thereof. The conductive regions overlap on opposite sides of the dielectric layer to form a plurality of capacitive elements. The capacitive elements are partially non-conductive at radio frequencies such that the electrical component tangent to the shield is other than zero, and the magnetic component perpendicular to the shield is essentially zero. In other words, the size and shape of the non-conductive and conductive regions are selected to develop a capacitive voltage across the capacitive elements at radio frequencies. Preferably, the capacitive elements are substantially non-conductive at audio frequencies. Thus, the RF magnetic shields of the present invention provide an electrical field that is uniform around the entire sample volume.

The RF magnetic shields of the present invention may be used with a variety of RF magnetic field coils such as a birdcage coil, a body coil or a surface coil. To this end, the RF magnetic shield may comprise an endcap for use with a birdcage coil, an open-ended cylinder for use with a body coil, or an annulus for use with a surface coil.

BRIEF DESCRIPTION OF THE DRAWINGS

FIG. 4 is a schematic illustration of a phase shifter network for use with the pulse generator and RF transceiver to drive the endcap and birdcage resonator in quadrature;

FIGS. 5A–5D are schematic illustrations of various phase shifter circuits for use in the network shown in FIG. 4;

FIG. 6 is a schematic illustration of an alternative pattern (four-fold symmetry) of conductive and non-conductive portions on either side of the RF magnetic shield;

FIG. 7 is a schematic illustration of another alternative pattern (six-fold symmetry) of conductive and non-conductive portions on either side of the RF magnetic shield;

DETAILED DESCRIPTION OF THE INVENTION

The following detailed description should be read with reference to the drawings in which similar elements in different drawings are numbered the same. The drawings, which are not necessarily to scale, depict illustrative embodiments and are not intended to limit the scope of the invention.

Figure 1:
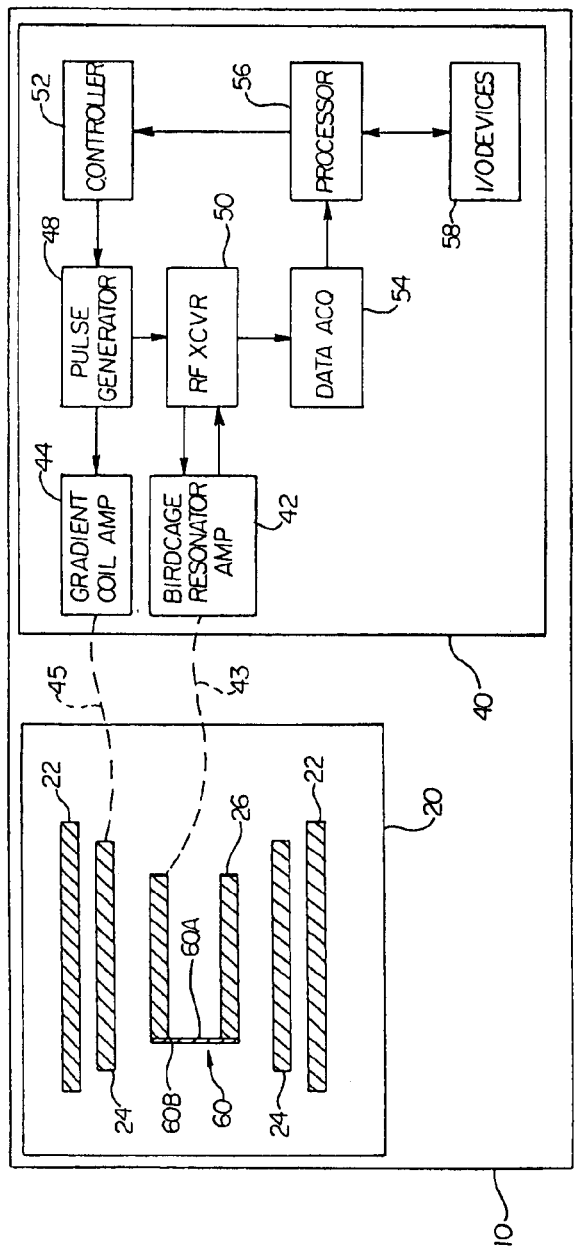
FIG. 1 is a schematic illustration of an MRI scanner in accordance with an embodiment of the present invention, showing the main coil, the gradient coils, the RF magnetic coil (birdcage resonator) with attached RF magnetic shield (endcap) in cross section, and the data processing and signal control system in block diagram.

Referring now to FIG. 1, a schematic illustration of an MRI scanner 10 in accordance with an embodiment of the present invention is shown. MRI scanner 10 includes a magnetic coil system 20 having a main coil 22 which generates the static magnetic field ($B_0$), gradient coils 24 (X, Y and Z coils shown collectively), and an RF magnetic coil 26 in the form of a birdcage resonator which generates the RF magnetic field ($B_1$) and receives the signal from the sample. An RF magnetic shield 60 in the form of an endcap is disposed at one end of the birdcage resonator 26, as will be discussed in more detail hereinafter.

The MRI scanner 10 also includes a data processing and signal control system 40 shown in block diagram. The birdcage resonator 26 is connected to a resonator amplifier 42 by way of cable 43. The gradient coils 24 are independently connected to a gradient coil amplifier 44 by way of cable 45. Signals are generated by a pulse generator 48 which may directly send signals to the gradient coil amplifier 44 and indirectly send signals to the resonator amplifier 42 by way of RF transceiver 50. The RF transceiver 50 may be used to transmit an RF signal to the birdcage resonator 26 to generate the RF magnetic field ($B_1$) and to receive signals from the birdcage resonator 26.

The analog signal received by the birdcage resonator 26 is transmitted to the data acquisition unit 54 by way of RF transceiver 50. The data acquisition unit 54 includes A/D circuits to convert the analog signal to a digital signal for processing by the processor 56. The digital signal is processed into representative text and/or images sent to the appropriate output device 58 such as a monitor. An appropriate input device 58 such as a keyboard is also connected to the processor 56 to provide control information (e.g., signal timing and amplitude) to the controller 52.

Figure 2:
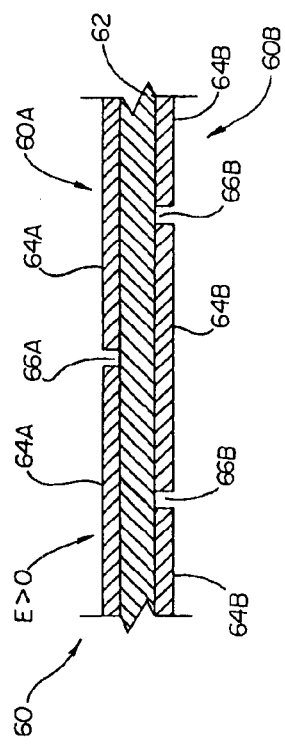
FIG. 2 is a partial cross-sectional view of the RF magnetic endcap shield used in the MRI scanner illustrated in FIG. 1.

Referring now to FIG. 2, a cross-sectional view of a portion of the RF magnetic endcap shield 60 is shown. The endcap shield 60 includes an inside surface 60A and an outside surface 60B. The endcap shield 60 substantially blocks RF magnetic fields but supports tangential electric fields, thereby reducing dielectric losses in the sample being imaged and reducing de-tuning effects in the resonator caused by the sample. Tangential electric fields are supported (i.e., the electric filed (E) near the surface 60A is greater than zero) by maintaining capacitive voltages across the non-conducting regions in the surface 60A at radio frequencies.

The RF shield 60 of the present invention differs from the prior art which essentially provided an RF shield that was highly conductive at radio frequencies such that the tangential electric field at the surface was essentially zero even at the non-conducting regions. The highly conductive RF shield of the prior art dictated electromagnetic boundary conditions which provided that the perpendicular component of magnetic field be zero at the surface and the tangential component of the electric field be zero at the surface. However, having a tangential electric field component equal to zero at the surface is not desirable because of possible de-tuning effects, dielectric losses, and the need for larger electric fields elsewhere. By contrast, the RF magnetic shield 60 of the present invention substantially blocks RF magnetic fields but supports tangential electric fields, thereby maintaining the advantages of controlling magnetic flux and avoiding the disadvantages of shorting the electric field.

As mentioned before, tangential electric fields are supported by maintaining a capacitive voltage across the surface of the RF shield 60 at radio frequencies. This may be accomplished, for example, by providing a dielectric layer 62 having conductive regions 64 disposed separated by non-conductive spaces 66 on either side 60A/60B of the shield 60. The conductive regions 64 overlap on opposite sides 60A/60B of the dielectric layer 62 as seen in FIG. 2 to form a plurality of capacitive elements. The capacitive elements are partially non-conductive at radio frequencies such that a capacitive voltage is created across the inside surface 60A of the shield 60 when the RF field ($B_1$) is activated. The capacitive voltage dictates that the average electrical field component tangent to the shield is other than zero at the inside surface 60A, while the magnetic component perpendicular to the shield is essentially zero near the inside surface 60A.

Figure 3B:
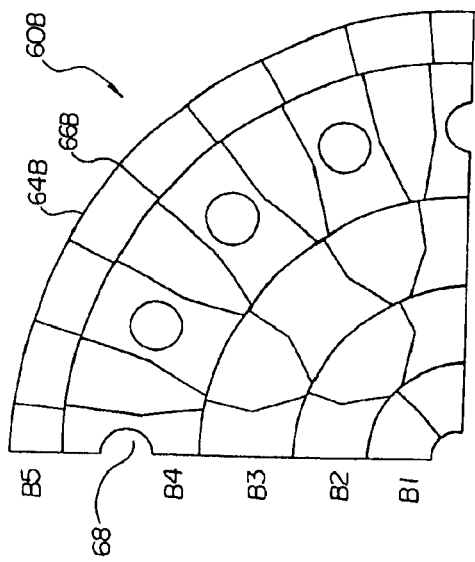
FIG. 3B is an outside end view of a quadrant of the RF magnetic endcap shield shown in FIG. 3A, illustrating the pattern of conductive and non-conductive portions on a first side of the endcap.
Figure 3C:
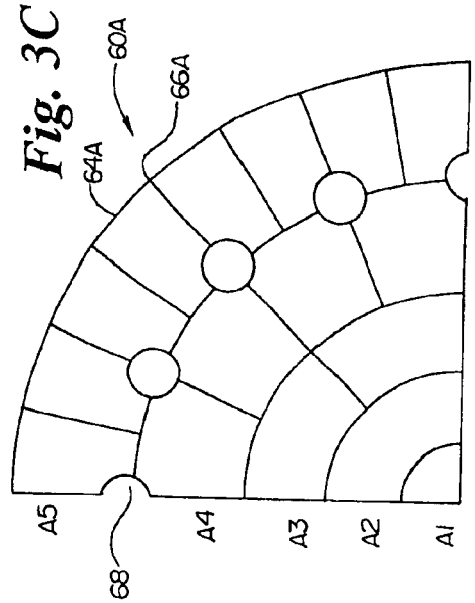
FIG. 3C is an inside end view of a quadrant of the RF magnetic endcap shield shown in FIG. 3A, illustrating the pattern of conductive and non-conductive portions on a second side of the endcap.
Figure 3A:
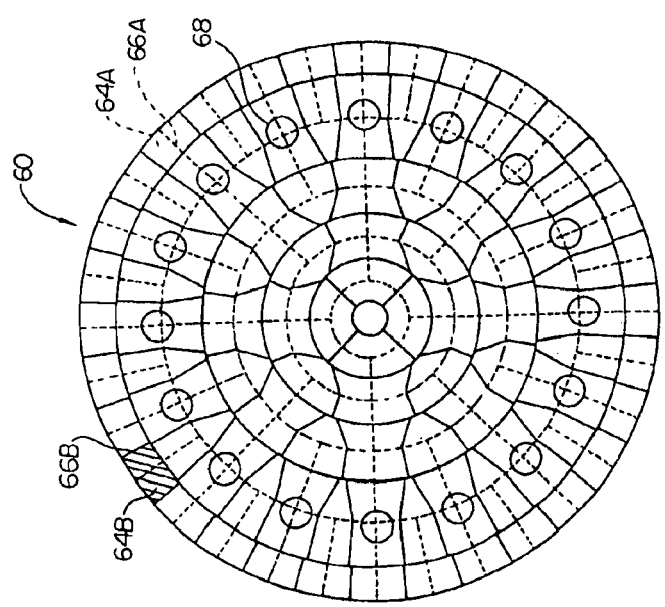
FIG. 3A is an outside end view of the RF magnetic endcap shield used in the MRI scanner illustrated in FIG. 1, showing the pattern (sixteen-fold symmetry) of conductive and non-conductive portions on either side of the endcap.

Referring now to FIG. 3A, an outside end view of the RF magnetic endcap shield 60 is shown. FIG. 3A schematically illustrates the pattern of conductive portions 64 and non-conductive 66 portions on either side 60A/60B of the endcap 60. In this particular embodiment, the pattern of conductive portions 64 and non-conductive 66 portions results in a shield 60 having sixteen-fold symmetry and is designed to serve as an endcap shield 60 for a sixteen (16) rung birdcage resonator. The sixteen rungs of the birdcage pass through holes 68 in the shield and attach to the single conductive region that surrounds each hole 68. The dielectric layer 62 may be formed of PTFE sold under the trade name TEFLON having a thickness of 0.005 inches. The conductive portions 64 may be formed of copper foil having a thickness of 0.0007 inches which is bonded to both sides of the dielectric layer 62. In this example, the endcap shield 60 may be formed of double-sided circuit board. The spaces or gaps 66 may be etched into the copper foil using conventional techniques.

The dotted lines in FIG. 3A represent the non-conductive spaces 66A defining conductive regions or pads 64A on the inside surface 60A, and the solid lines represent the non-conductive spaces 66B defining conductive regions or pads 64B on the outside surface 60B, which overlap to define a plurality of capacitor plates. The pattern of conductive regions 64 and non-conductive spaces 66 may be more clearly seen in FIGS. 3B and 3C which show outside and inside views, respectively, of a quadrant of the endcap shield 60. As seen in FIG. 3C, the non-conductive spaces 66A divide the inside surface 60A into a circle A1 and four annuli A2, A3, A4, and A5. As seen in FIG. 3B, the non-conductive spaces 66B divide the outer surface 60B into five annuli B1, B2, B3, B4, and B5 that overlap the annuli A2, A3, A4 and A5 on the inside surface 60A.

Annuli A2, A3, A4, and A5 are divided radially into four (4), eight (8), sixteen (16), and thirty-two (32) segments, respectively. Similarly, annuli B1, 2B, B3, B4 and B5 are divided into four (4), eight (8), sixteen (16), thirty-two (32), and thirty-two (32) segments, respectively. One segment of annulus B1 overlaps a portion of circle A1 and a portion of two segments of annulus A2. The radii of circle A1 and annulus B1 are adjusted to make each of the three overlapping areas equal and thus have equal capacitance. Hence, the overlap between circle A1 and annulus B1 produces four (4) capacitors; and the overlap between annulus B1 and annulus A2 produces eight (8) capacitors.

Every other segment of annulus B2 overlaps a potion of one segment of annulus A2 and a portion of two segments of annulus A3. The remaining segments of annulus B2 partly overlap two segments of both annulus A2 and annulus A3. The overlap of annulus A2 and annulus B2 produces twelve (12) capacitors, and the overlap between annulus B2 and annulus A3 forms sixteen (16) capacitors. The non-conductive 66B partitions of annulus B2 and the radii of the annuli are adjusted to make all twenty-eight (28) capacitors equal to those formed by the overlapping portions of circle A1 and annulus A2.

In a similar fashion, the successive overlapping annuli are segmented into rings of capacitors containing twenty-four (24), thirty-two (32), forty-eight (48), sixty-four (64), and sixty-four (64) capacitors. The locations of the non-conductive partitions 66A/66B of annuli A4, A5, and B4 are adjusted to compensate for the missing area of the rung holes 68. Thus, the area of the shield 60 is divided into 272 equal overlapping pads, which form a mesh of capacitors. Individual conductive pads 64 are nodes in the mesh and capacitively couple to three (3), four (4), or five (5) adjacent nodes.

By way of example, the endcap shield 60 may have an overall diameter of 16 inches and may be designed for operation at 64 MHz in a 1.5 T scanner. Using the pattern described above, 272 approximately equal capacitors of about 0.65 square inches or 65 pF each are formed (unetched double-sided PTFE circuit board has a capacitance of about 100 pF per square inch). The non-conductive gaps 66 between individual conductive pads 64 may be about 0.03 inches wide.

When assembled with a birdcage resonator 26 as shown in FIG. 1, the endcap shield 60 provides a net series parallel combination of the capacitors which support about one quarter of the total capacitive voltage developed at the resonant frequency. The capacitors on the open endring of the resonator 26 also support about one quarter of the capacitive voltage. Likewise, the rungs on each side of the birdcage resonator 26 support about one quarter of the capacitive voltage. Therefore, a purpose of the chosen distribution of capacitive voltage drops is to create an electric field E that is primarily tangential to and uniform intensity around the sample volume of the resonator 26. This is a preferred electric field distribution to reduce dielectric losses in the sample and detuning of the resonator 26 by the sample.

Those skilled in the art will recognize that the endcap shield 60 may be adapted to operate under different conditions. For example, the endcap shield 60 may be adapted to operate at twice the frequency in a 3T scanner by increasing the number of conductive pads to 496. In this example, the successive annuli on the inside surface 60A may be divided into 1, 4, 8, 16, 32, 32, and 32 conductive pads. The annuli on the outside surface 60B may be divided into 4, 8, 16, 16, 32, 32, and 32 individual conductive pads. Thus, each conductive pad 64 is about 0.33 square inches or 33 pF. The rest of the capacitors on the rungs and endring are then likewise scaled to give about one quarter of the total capacitive voltage drop on each side of the resonator.

The binary progression incorporated in this pattern is utilized to accommodate the sixteen-fold symmetry inherent in a birdcage structure 26. All adjacent rungs are separated by the same amount of capacitance. A Spice simulation of the capacitor network as part of a birdcage resonator indicates that current flowing on the shield 60 will produce an approximately uniform rate of voltage drop across the inner surface 60A of the shield 60. At a distance from the shield 60 on the order of the width of the conductive regions 64, the electric field due to the discrete voltage steps between each capacitor blends to give an approximately uniform electric field. The net capacitive impedance offered by the shield 60, the rungs, and the open endring can be adjusted to provide a bandpass or hybrid version of the birdcage resonator that will generate a fairly uniform tangential electric field distribution in the sample volume.

The proposed pattern described above utilizes a high percentage of the surface area in order to obtain capacitance needed for operation at 64 MHz. To work at higher operating frequencies, the net capacitance may be reduced by widening the non-conductive gaps 66 to reduce the overlap area or by using more annuli to connect more capacitors in series. For operation at lower frequencies, the number of annuli may be reduced or the thickness the dielectric layer 62 may be decreased to increase net capacitance.

The capacitive endcap shield 60 of the present invention also may be used to couple RF power into the resonator 26 during the transmit mode and/or to couple the sample's small signal out of the resonator 26 during the receive mode. The endcap shield 60 may be driven or the signal may be received by tapping between the central ground point on circle A1 and one of the conductive regions 64 which becomes a drive point. The impedance may be selected by varying the radial distance between the center and drive point. The input impedance increases in discrete steps as the radial distance between the center and drive point increases.

The endcap 60 may be driven by utilizing one drive point or by utilizing two drive points located ninety (90) degrees apart on the same annulus. More than two drive points may be utilized by properly distributing the drive power or by coherently combining the received MRI signal. More than two drive points are useful at higher frequencies where heavy coil loading leads to non-uniform distribution of the RF field or non-uniform coil sensitivity.

In order to utilize two or more drive points, power splitters/combiners and phase shifters may be used. For example, the coupling may be made to the conductive plates 64 located at 0, 90, 180, and 270 degrees on annulus B3 with suitable phase shifter circuitry that imposes a 0, 90, 180, and −90 degree phase shift. Phase shifter network 70 illustrated schematically in FIG. 4 provides four drive points 75, 76, 77, 78 utilizing a quadrature splitter/combiner 72 to drive the horizontal and vertical modes of the birdcage resonator 26 with a 90 degree phase shift between them. The phase shifter 74 leading to each drive point 75, 76, 77, 78 provides a plus or minus ninety-degree shift and also transforms the impedance at each of the drive points 75, 76, 77, 78 to equal twice the characteristic impedance Zo of the power combiner. Possible lumped element phase shifter circuits 74A–74D, given in FIGS. 5A–5D, respectively, behave like a quarter wavelength transformer with characteristic impedance Zov or Zoh. FIGS. 5A–5D schematically illustrate a lowpass tee, a lowpass pi, a highpass tee, and a highpass pi network. Depending on the number of desired drive points, the appropriate phase shifter network may be used. For example, the endcap 60 may be driven at eight points with phase shifts of 45 degrees or driven at 16 points with phase shifts of 22.5 degrees.

The endcap shield 60 described above having sixteen-fold symmetry is particularly suited for use in combination with a sixteen (16) rung birdcage resonator 26. With other types of resonators and in some other applications, it is desirable to have capacitive impedance as isotropic as possible. To this end, FIGS. 6 and 7 provide schematic illustrations of alternative patterns of conductive and non-conductive portions on either side of the endcap shield. The hexagonal array of shield 90 is readily adapted to birdcage resonators that possess 6, 12, 18, or 24 rungs. Both the square array of shield 80 and the hexagonal array of shield 90 are readily adapted to form a cylindrical shield 160 to enclose a body coil 126 described with reference to FIG. 8.

In FIG. 6, shield 80 has a pattern with four-fold symmetry and is one of the simplest patterns for overlapping capacitor plates. The shield 80 may be constructed of an array of conductive squares 84 separated by non-conductive gaps 86 on either side of a dielectric layer. Except as described herein, the shield 80 having four-fold symmetry is similar in design, manufacture, function and use as the shield 60 having sixteen-fold symmetry.

The dotted lines in FIG. 6 represent the non-conductive spaces 86A defining conductive squares 84A on the inside surface, and the solid lines represent the non-conductive spaces 86B defining conductive squares 84B on the outside surface, which overlap to define a plurality of capacitor plates. The conductive squares 84A are positioned one half of the diagonal distance from the conductive squares 84B, such that the squares 84A on one side are centered on the corners of the squares 84B on the other side. The capacitive impedance per unit length is equal along the horizontal and vertical directions, but differs from that of the diagonal directions.

In FIG. 7, shield 90 has a pattern with six-fold symmetry. The pattern of shield 90 uses hexagons and triangles as capacitor plates on opposite sides of the dielectric substrate to provide six-fold symmetry around the center of each hexagon. Except as described herein, the shield 90 having six-fold symmetry is similar in design, manufacture, function and use as the shield 60 having sixteen-fold symmetry.

The dotted lines in FIG. 7 represent the non-conductive spaces 96A defining conductive triangles 94A on the inside surface, and the solid lines represent the non-conductive spaces 96B defining conductive hexagons 94B on the outside surface. Each hexagon 94B partially overlaps six triangles 94A, and each triangle 94A overlaps three hexagons 94B to define a plurality of capacitor plates. The capacitive impedance per unit length is equal along three directions in the plane and thus is more isotropic than the pattern of squares provided by shield 80.

Figure 8:
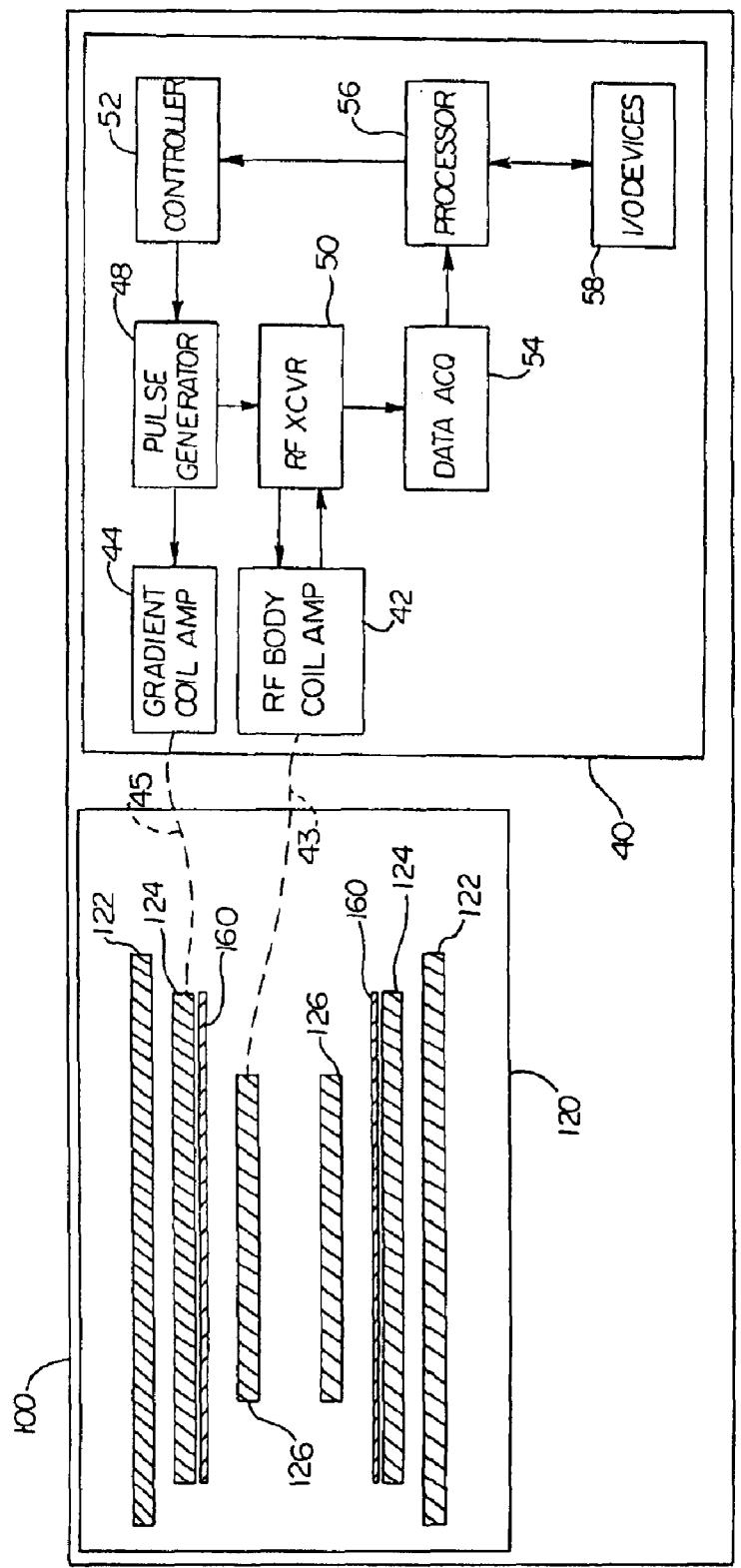
FIG. 8 is a schematic illustration of an MRI scanner in accordance with another embodiment of the present invention, showing the main coil, the gradient coils, the RF magnetic coil (body coil) and RF magnetic shield (cylinder) in cross section, and the data processing and signal control system in block diagram.

FIG. 8 illustrates a cylindrical shield 160 for use with a body coil 126 in accordance with another embodiment of the present invention. The MRI scanner 100 shown in FIG. 8 is similar to the MRI scanner 10 shown in FIG. 1 except that the MRI scanner 100 uses a body coil 126 rather than a birdcage resonator, and therefore uses a shield 160 having a different geometry.

MRI scanner 100 includes a magnetic coil system 120 having a main coil 122 which generates the static magnetic field ($B_0$), gradient coils 124 (X, Y and Z coils shown collectively), and an RF magnetic coil 126 in the form of a body coil which generates the RF magnetic field ($B_1$) and receives the signal from the body sample. The RF magnetic shield 160 is in the form of an open-ended cylinder and is disposed about the body coil 126. The data processing and signal control system 40 shown in block diagram is substantially the same as described previously.

Figure 9:
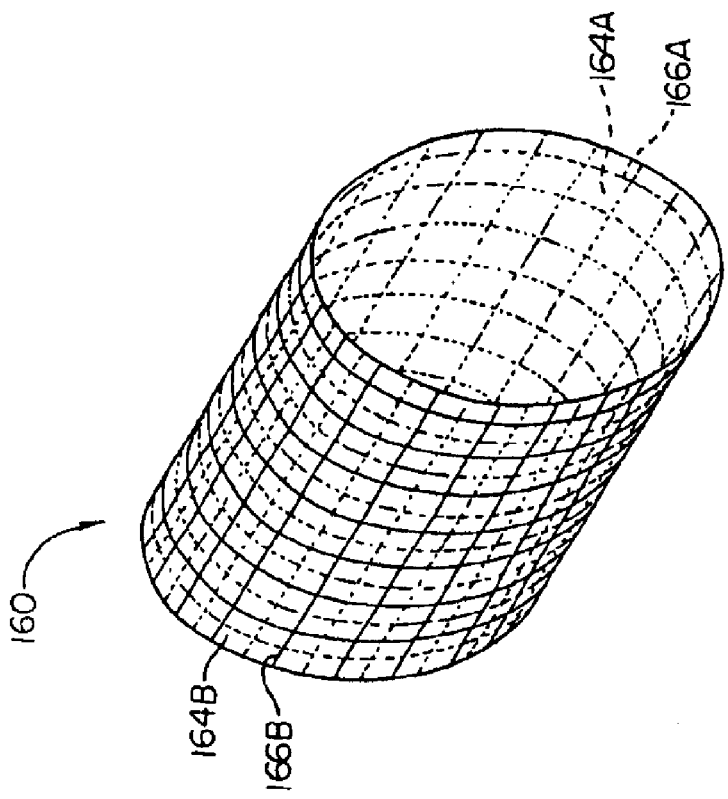
FIG. 9 is an isometric schematic illustration of the RF magnetic cylinder shield for use in the MRI scanner illustrated in FIG. 8.

FIG. 9 schematically illustrates the RF magnetic cylinder shield 160. Except as described herein, the cylindrical shield 160 is similar in design, manufacture, function and use as the endcap shield 60 discussed previously. In this particular embodiment, the cylindrical shield 160 is constructed from an array of overlapping squares as described with reference to FIG. 6. The dotted lines in FIG. 9 represent the non-conductive spaces 166A defining conductive squares 164A on the inside surface, and the solid lines represent the non-conductive spaces 166B defining conductive squares 164B on the outside surface, which overlap to define a plurality of capacitor plates. Those skilled in the art will recognize that other suitable patterns may be utilized, such as the hexagonal pattern discussed with reference to FIG. 7. It should be noted that the RF magnetic cylinder shield 160 by itself forms a solenoid with a self-resonant frequency determined by its net circumferential series capacitance and inductance. Used as a RF solenoid, this configuration has the benefits of homogeneous RF field, a uniform tangential electric field, and minimal eddy currents induced by switch gradient fields.

Figure 10:
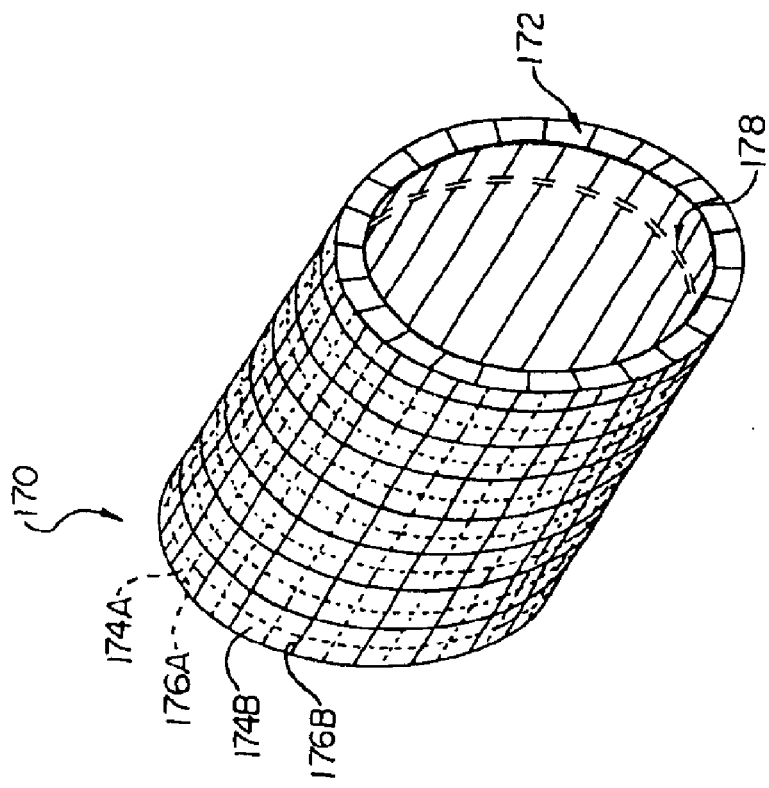
FIG. 10 is an isometric schematic illustration of an alternative RF magnetic cylinder shield for use with a Bridges-style resonator.

FIG. 10 shows a Bridges-type resonator, which is a modification of the resonator described in U.S. Pat. No. 4,751,464 to Bridges, the entire disclosure of which is hereby incorporated by reference. The Bridges-type resonator has been modified to incorporate an outer shield 170 similar to shield 160. The dotted lines in FIG. 10 represent the non-conductive spaces 176A defining conductive squares 174A on the inside surface of the outer shield 170, and the solid lines represent the non-conductive spaces 176B defining conductive squares 174B on the outside surface of the outer shield 170, which overlap to define a plurality of capacitor plates.

The endrings 172 also include etched capacitors 178 separating the rungs. If the capacitors 178 on each of the rungs of the resonator were shorted out, the resonator would resonate at a self-resonant frequency determined by the capacitors located in the outer shield 170 and endrings 172. In order for the outer shield 170 to contain the RF magnetic field inside the cylinder, the capacitors 178 in the rungs are added so the operating frequency is above the self-resonant frequency. In other words, in order to contain the RF magnetic field, the capacitors in the outer shield are chosen large enough so that the outer shield 170 appears to be inductive at the operating frequency.

A similar shield may be applied to a variant of the Bridges-style resonator, which has been referred to as a TEM resonator. The TEM resonator uses piston type capacitors incorporated in the rungs.

Figure 11:
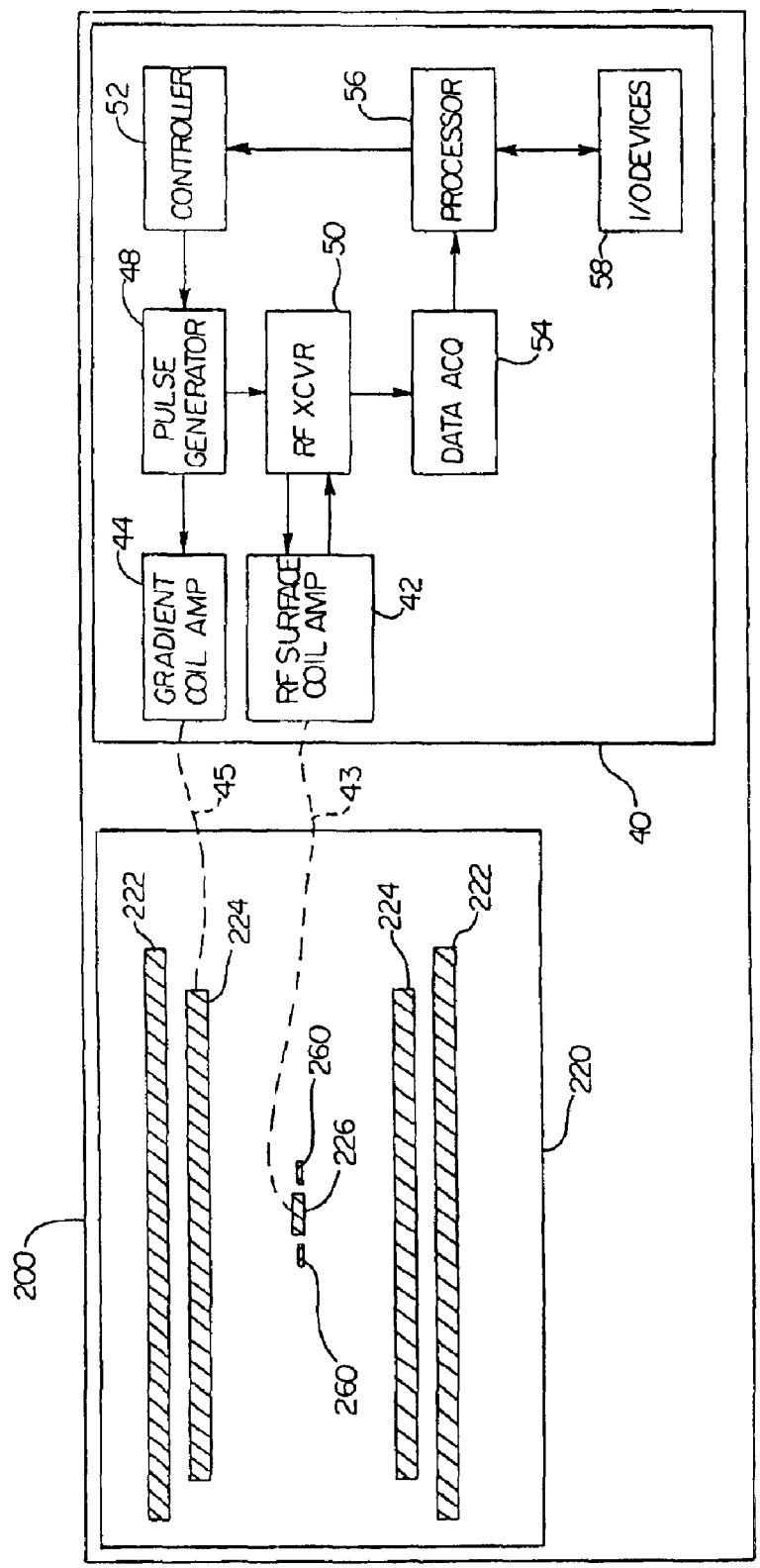
FIG. 11 is a schematic illustration of an MRI scanner in accordance with another embodiment of the present invention, showing the main coil, the gradient coils, the RF magnetic coil (surface coil) and RF magnetic shield (annulus) in cross section, and the data processing and signal control system in block diagram.

FIG. 11 illustrates an annular shield 260 for use with a surface coil 260 in accordance with another embodiment of the present invention. The MRI scanner 200 shown in FIG. 11 is similar to the MRI scanner 10 shown in FIG. 1 except that the MRI scanner 200 uses a surface coil 226 rather than a birdcage resonator, and therefore uses a shield 260 having a different geometry.

MRI scanner 200 includes a magnetic coil system 220 having a main coil 222 which generates the static magnetic field ($B_0$), gradient coils 224 (X, Y and Z coils shown collectively), and an RF magnetic coil 226 in the form of a surface coil which generates the RF magnetic field ($B_1$) and receives the signal from the surface of the sample. The RF magnetic shield 260 is in the form of a substantially planar annulus and is disposed about the surface coil 226. The data processing and signal control system 40 shown in block diagram is substantially the same as described previously.

Figure 12:
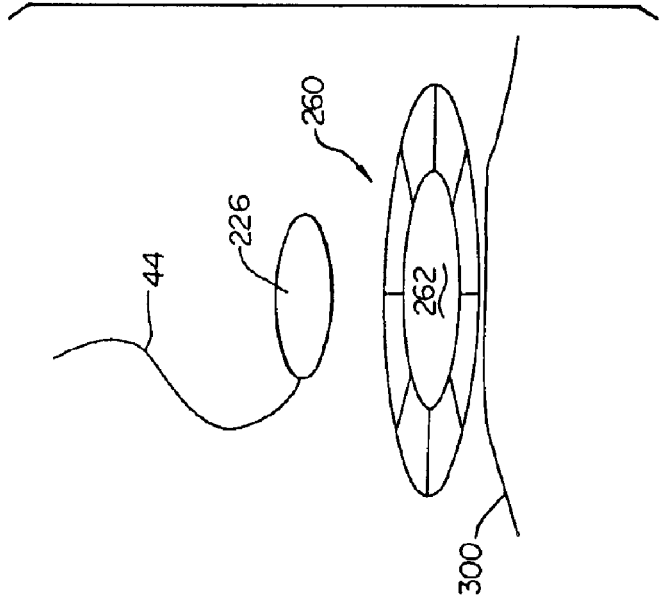
FIG. 12 is a schematic illustration of the surface coil and the RF magnetic annulus shield used in the MRI scanner illustrated in FIG. 11, showing the position of the surface coil and annulus shield in relation to the body surface being imaged.

FIG. 12 schematically illustrates the orientation of the surface coil 226 and the annulus shield 260 in relation to the sample or body surface 300 being imaged. For purposes of illustration only, the distance between the surface coil 226 and the surface 300 of the sample has been exaggerated. The annulus shield 260 includes a center hole 262 which approximates the size and shape of the surface coil 226. The annulus shield 260 is positioned on the surface 300 of the sample and the surface coil 226 is placed in the hole 262. When so positioned, the annulus shield 260 masks all but a local region of the sample exposed to the surface coil 260. Therefore, RF noise arising from more distant regions of the sample is not coupled into the surface coil. The partitions in the annulus prevent eddy currents due to the switched gradient fields.

Figure 13:
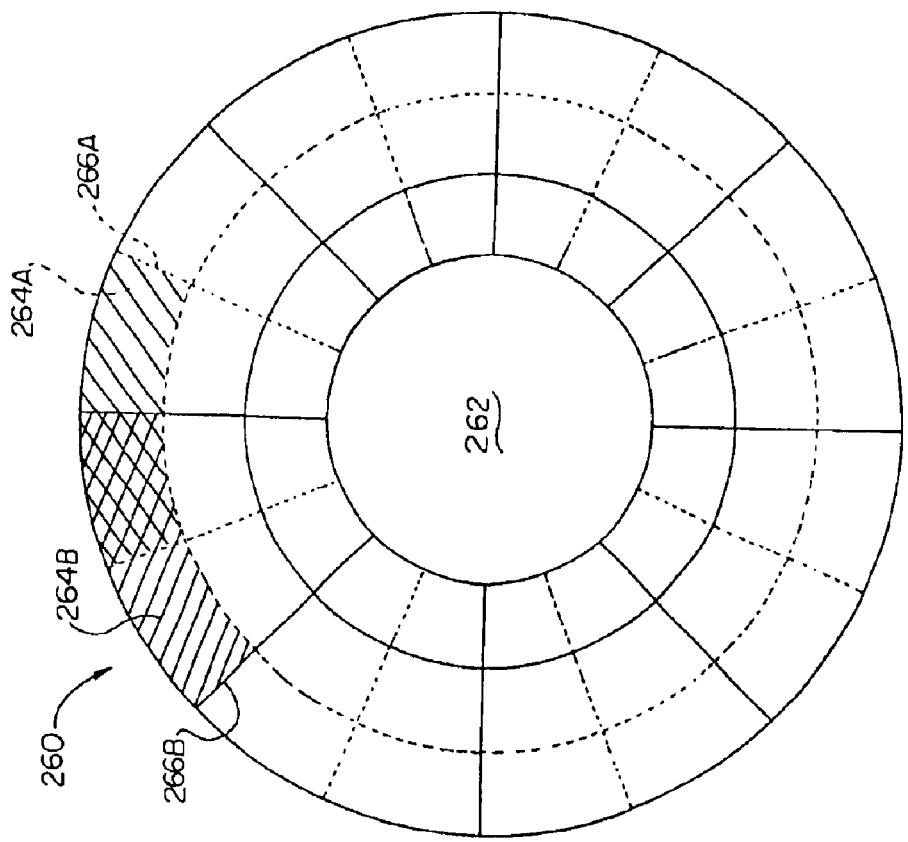
FIG. 13 is a top view of the RF magnetic annulus shield used in the MRI scanner illustrated in FIG. 11, showing an example of a suitable pattern of conductive and non-conductive portions on either side of the annulus shield.

FIG. 13 shows an example of a pattern of conductive 264 and non-conductive 266 portions on either side of the annulus shield 260. Except as described herein, the annulus shield 260 is similar in design, manufacture, function and use as the endcap shield 60 described previously. The dotted lines in FIG. 13 represent the non-conductive spaces 266A defining conductive regions 264A on the inside surface (facing surface 300), and the solid lines represent the non-conductive spaces 266B defining conductive regions 264B on the outside surface, which overlap to define a plurality of capacitor plates. In this particular example, the non-conductive gaps or spaces 266 divide the conductive regions 264 into two (2) overlapping annuli on either side, and eight (8) radial segments per annuli, for a total of sixteen (16) conductive regions 264 per side. Without the surface coil present, the annulus shield with its intrinsic series of capacitors can form a resonant loop, whose frequency may modify that of the surface coil. Usually the capacitive elements of the annulus would be taken large enough so that its self-resonant frequency is substantially lower than that of the surface coil. Any pattern of overlapping squares, triangles or hexagons could be used on the annulus provided their net capacitance is sufficiently large.

From the foregoing, it will be apparent to those skilled in the art that the present invention provides several embodiments of RF shields 60, 80, 90, 160, 170, 260 that block RF magnetic fields but support tangential electric fields. A secondary attribute of these shields is their reduction of gradient field eddy currents without utilizing large numbers of discrete bypass capacitors. The shield designs may be fabricated from double-sided PTFE circuit board that is etched to provide a mesh of capacitors. The etched pattern may be tailored to fit the particular application. Examples have been given for an endcap shield 60 on the end of a birdcage coil, a cylindrical shield 160 that separates the MRI body coil from the gradient coil, a cylindrical shield 170 that forms the outer surface of a Bridges-type or TEM resonator, and an annular shield 260 to limit RF penetration in parts of the body that are not being imaged.

Those skilled in the art will recognize that the present invention may be manifested in a variety of forms other than the specific embodiments described and contemplated herein. Accordingly, departures in form and detail may be made without departing from the scope and spirit of the present invention as described in the appended claims.

What is claimed is:

1. An RF magnetic shield for use in a radiofrequency system including an RF magnetic field coil for generating an RF magnetic field having a magnetic component and an electric component, the RF magnetic shield comprising:
   a dielectric layer having a plurality of conductive regions separated by non-conductive regions on each side of the dielectric layer, the conductive regions overlapping on opposite sides of the dielectric layer to form a plurality of capacitive elements which are partially non-conductive at radio frequencies such that the electrical component tangent to the shield is other than zero and the magnetic component perpendicular to the shield is essentially zero:

wherein the RF magnetic field coil and the RF magnetic shield define a sample volume, and the electrical component is substantially uniform around all of the sample volume.

2. An RF magnetic shield as in claim 1, wherein the conductive regions define a pattern having approximately equal capacitive impedance per unit length in at least one direction.

3. An RF magnetic shield as in claim 1, wherein a capacitive voltage is developed across the capacitive elements at radio frequencies.

4. An RF magnetic shield as in claim 3, wherein the capacitive voltage developed across the capacitive elements at radio frequencies is about one quarter of a total capacitive voltage developed at a resonant frequency.

5. An RF magnetic shield as in claim 3, wherein the conductive regions have a size and shape, and the non-conductive regions have a size and shape, and wherein the size and shape of the non-conductive and conductive regions are selected to develop the capacitive voltage across the capacitive elements at radio frequencies.

6. An RF magnetic shield as in claim 3, wherein the capacitive elements are substantially non-conductive at audio frequencies.

7. An RF magnetic shield as in claim 1, wherein the RF magnetic field coil comprises a birdcage coil, and wherein the RF magnetic shield comprises an endcap on an end of the birdcage coil.

8. An RF magnetic shield as in claim 7, wherein the shield is substantially planar and circular.

9. An RF magnetic shield as in claim 7, wherein the birdcage resonator has a plurality of rungs, and wherein a plurality of conductive regions on the shield are connected to the rungs.

10. An RF magnetic shield as in claim 7, wherein the conductive regions define a pattern having sixteen-fold symmetry.

11. An RF magnetic shield as in claim 7, wherein the pattern includes a plurality of annular regions divided into a plurality of radial segments.

12. An RF magnetic shield as in claim 7, wherein one or more of the conductive regions is used as a drive point.

13. An RF magnetic shield as in claim 1, wherein the RF magnetic field coil comprises a cylindrical body coil, and wherein the RF magnetic shield comprises a cylinder disposed about the body coil.

14. An RF magnetic shield as in claim 13, wherein the conductive regions define a pattern having four-fold symmetry.

15. An RF magnetic shield as in claim 13, wherein the conductive regions define a pattern having six-fold symmetry.

16. An RF magnetic shield as in claim 1, wherein the RF magnetic field coil comprises a surface coil, and wherein the RF magnetic shield comprises an annulus disposed about the surface coil.

17. An RF magnetic shield as in claim 16, wherein the RF magnetic field coil is substantially planar and annular.

18. An RF magnetic shield as in claim 17, wherein the RF magnetic field coil includes a hole which is sized and shaped to match the surface coil.

19. A magnetic resonance imaging (MRI) system, comprising:
    an RF magnetic field coil for generating an RF magnetic field having a magnetic component and an electric component; and
    an RF magnetic shield disposed adjacent the RF magnetic field coil, the RF magnetic shield being partially non-conductive at radio frequencies such that the average electrical component tangent to the shield is other than zero and the magnetic component perpendicular to the shield is essentially zero;
    wherein the RF magnetic field coil and the RF magnetic shield define a sample volume, and the electrical component is uniform around all of the sample volume.

20. An RF magnetic shield as in claim 19, wherein a capacitive voltage is developed across the capacitive elements at radio frequencies.

21. An RF magnetic shield as in claim 20, wherein the capacitive voltage developed across the capacitive elements at radio frequencies is about one quarter of a total capacitive voltage developed at a resonant frequency.

22. An RF magnetic shield as in claim 19, wherein the conductive regions have a size and shape, and the non-conductive regions have a size and shape, and wherein the size and shape of the non-conductive and conductive regions are selected to develop the capacitive voltage across the capacitive elements at radio frequencies.

23. An RF magnetic shield as in claim 19, wherein the capacitive elements are substantially non-conductive at audio frequencies.

* * * * *

UNITED STATES PATENT AND TRADEMARK OFFICE
CERTIFICATE OF CORRECTION

PATENT NO. : 6,888,153 B2
DATED : May 3, 2005
INVENTOR(S) : Cecil E. Hayes

It is certified that error appears in the above-identified patent and that said Letters Patent is hereby corrected as shown below:

Column 8,
Line 28, delete "comers", and insert therefor -- corners --.

Signed and Sealed this

Twenty-eighth Day of June, 2005

JON W. DUDAS
*Director of the United States Patent and Trademark Office*